United States Patent
Jedamzik et al.

(10) Patent No.: US 11,465,933 B2
(45) Date of Patent: Oct. 11, 2022

(54) HIGHLY HOMOGENEOUS GLASS-CERAMIC COMPONENT

(71) Applicant: SCHOTT AG, Mainz (DE)

(72) Inventors: Ralf Jedamzik, Griesheim (DE); Steffen Grün, Wallhausen (DE); Thomas Lifka, Mainz-Bretzenheim (DE); Johann Faderl, Nieder-Haibersheim (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 15/243,078

(22) Filed: Aug. 22, 2016

(65) Prior Publication Data

US 2016/0355433 A1    Dec. 8, 2016

Related U.S. Application Data (63) Continuation of application No. PCT/EP2015/053576, filed on Feb. 20, 2015.

(30) Foreign Application Priority Data

Feb. 21, 2014  (DE) ................. 10 2014 002 253.6
Jun. 18, 2014  (DE) ................. 10 2014 211 700.3

(51) Int. Cl.
| | | |
|---|---|---|
| C03C 10/00 | (2006.01) | |
| G03F 1/22 | (2012.01) | |
| G02B 7/18 | (2021.01) | |
| C03C 3/097 | (2006.01) | |
| C03C 1/00 | (2006.01) | |

(Continued)

(52) U.S. Cl.
CPC .......... C03C 10/0027 (2013.01); C03B 32/02 (2013.01); C03C 1/00 (2013.01); C03C 3/097 (2013.01); G02B 7/181 (2013.01); G03F 1/22 (2013.01); G03F 1/60 (2013.01); C03C 2204/00 (2013.01)

(58) Field of Classification Search
None
See application file for complete search history.

(56) References Cited

U.S. PATENT DOCUMENTS 3,642,504 A   2/1972  Petzold
4,172,712 A * 10/1979 Heller ................ B01F 7/022
                                                366/301

(Continued)

FOREIGN PATENT DOCUMENTS

DE   1902432   10/1964
DE   1596860   9/1970

(Continued)

OTHER PUBLICATIONS

DE 102004052514 A1—Bib Data and Translation; May 2006; Germany; Mueller Rudolf.*

(Continued)

Primary Examiner — Humera N. Sheikh
Assistant Examiner — Elizabeth D Ivey
(74) Attorney, Agent, or Firm — Ruggiero McAllister & McMahon LLC (57) ABSTRACT

A glass-ceramic component is provided that has a low average coefficient of thermal expansion (CTE) and a high CTE homogeneity. The use of such a component and a process for producing such a component are also provided.

21 Claims, 4 Drawing Sheets (51) Int. Cl.
　　　*C03B 32/02*　　　(2006.01)
　　　*G03F 1/60*　　　(2012.01)

(56) References Cited

U.S. PATENT DOCUMENTS

| | | | |
|---|---|---|---|
| 4,851,372 A | | 7/1989 | Lindig |
| 5,336,643 A | * | 8/1994 | Goto .................. C03C 10/0045 501/4 |
| 5,591,682 A | | 1/1997 | Goto |
| 7,678,720 B2 | | 3/2010 | Nakajima |
| 2002/0192422 A1 | * | 12/2002 | Conzone ................. C03C 27/06 428/64.1 |
| 2003/0125184 A1 | | 7/2003 | Mitra |
| 2005/0197242 A1 | * | 9/2005 | Mitra .................. C03C 10/0027 501/7 |
| 2007/0093375 A1 | * | 4/2007 | Nakajima ............... C03C 3/097 501/4 |
| 2007/0281849 A1 | | 12/2007 | Yagi |
| 2007/0293386 A1 | | 12/2007 | Goto |
| 2009/0315202 A1 | * | 12/2009 | de Mollerat du jeu ... B24B 1/00 264/2.7 |
| 2010/0028787 A1 | | 2/2010 | Koike |
| 2010/0224619 A1 | | 9/2010 | Schoenberger |
| 2011/0211178 A1 | * | 9/2011 | Sogard ............... G03F 7/70875 355/30 |
| 2011/0226231 A1 | * | 9/2011 | Siebers .................. C03C 3/087 126/211 |
| 2012/0182636 A1 | | 7/2012 | Siebert |
| 2013/0063833 A1 | | 3/2013 | Lemmen |
| 2014/0320990 A1 | * | 10/2014 | Gilbert .................. G02B 7/183 359/853 |
| 2015/0158759 A1 | | 6/2015 | Jedamzik |
| 2017/0341991 A1 | * | 11/2017 | Mazany .................. C04B 41/52 |

FOREIGN PATENT DOCUMENTS

| | | | | |
|---|---|---|---|---|
| DE | 102004052514 | | 5/2006 | |
| DE | 102004052514 A1 | * | 5/2006 | ............. C03B 19/02 |
| EP | 1321440 | | 6/2003 | |
| EP | 1516863 | | 3/2005 | |
| EP | 1516863 A1 | * | 3/2005 | ......... C03C 10/0045 |
| JP | 2006103988 | | 4/2006 | |
| JP | 2007326722 | | 12/2007 | |
| JP | 2007326723 | | 12/2007 | |
| JP | 2010045211 | | 2/2010 | |
| JP | 2010064950 | | 3/2010 | |
| JP | 2010135732 | | 6/2010 | |
| JP | 2010202510 | | 9/2010 | |
| JP | 2011073935 A | * | 4/2011 | |
| JP | 2011073936 | | 4/2011 | |
| WO | 2011138340 | | 11/2011 | |
| WO | WO-2013001177 A2 | * | 1/2013 | ............. G02B 7/183 |
| WO | 2015124710 | | 8/2015 | |

OTHER PUBLICATIONS

Arvind Ananthanarayanan1, Rakesh Kumar1, Shovit Bhattacharya1, V K Shrikhande1 and G P Kothiyal; Some properties of lithium aluminium silicate (LAS) glass-ceramics used in glass-ceramic to metal compressive seal for vacuum applications Journal of Physics: Conference Series 114 (2008) (Year: 2008).*

Bib Data and Translation; JP2011073935A; Murozumi Hisashi; Apr. 14, 2011 (Year: 2011).*

Döhring etal; "Forty years of ZERODUR® mirror substrates for astronomy—Review and Outlook" from IDS dated Oct. 2, 2020 (Year : 2006) From IDS dated Oct. 2, 2020.*

Fenn et al; "Characterization and Characteristics of a ULE® Glass Tailored for the EUVL Needs"; SPIE Conference 2002 (Year: 2002).*

International Preliminary Report on Patentability dated Aug. 23, 2016 for corresponding PCT/EP2015/053576, 9 pages.

International Search Report of the International Searching Authority dated May 13, 2015 for corresponding PCT/EP2015/053576.

Written Opinion of the International Searching Authority dated May 13, 2015 for corresponding PCT/EP2015/053576.

Mueller et al., "Ultraprecision Dilatometer System for Thermal Expansion Measurements on Low Expansion Glasses", 12th Thermal Expansion Symposium, Pittsburgh/PA, P.S. Gaal and D.E. Apostolescu Eds., 1997, 5 pages.

Bach "Low Thermal Expansion Glass Ceramics", Springer Verlag Berlin, Heidelberg, New York, 1995, ISBN 3-540-58598-2, pp. 107-214.

Jedamzik, "ZERODUR Tailored for Cryogenic Application", Proc of SPIE vol. 9151, Jul. 18, 2014, pp. 91512P-1 to 91512P-10.

Burge, "Thermal Expansion of Borosilicate Glass, Zerodur, Zerodur M, and Unceramized Zerodur at Low Temperatures", Applied Optics, vol. 38, No. 34, Dec. 1, 1999, pp. 7161-7162.

Collocott et al., "Heat Capacity and Thermal Expansion of Zerodur and Zerodur M at Low Temperatures", Cryogenics, Elsevier, Kidlington, GB, vol. 31, No. 2, Feb. 1, 1991, pp. 102-104.

Hartmann, "Zero-Expansion Glass Ceramic ZERODUR—Recent Developments Reveal High Potential", Proceedings of SPIE—International Society for Optical Engineering, US, vol. 8450, Sep. 13, 2012, pp. 845022-1 to 845022-13.

Dohring, "Manufacturing of Lightweighted ZERODUR Components at SCHOTT", SPIE, vol. 6666, 2007, pp. 666602-1-666602-9.

Jedamzik, "Homogeity of the Linear Thermal Expansion Coefficient of ZERODUR Measured with Improved Accuracy", Proceedings of SPIE, vol. 6273, Jun. 14, 2006, pp. 627306-1 to 627306-12.

Jedamzik, "Homogeneity of the Coefficient of Linear Thermal Expansion of ZERODUR", Proceedings of SPIE, Optical Materials and Structures Technologies II, vol. 5868, Aug. 18, 2005.

Westerhoff, "Zero Expansion Glass Ceramic ZERODUR®—Roadmap for Advanced Lithography", Proceedings of SPIE—Optical Microlithography XXVI, vol. 8683, 2013.

Döhring, "Forty years of ZEFIODUR mirror substrates for astronomy—Review and Outlook", SPIE, vol. 7018, No. 701838, Jul. 6, 2006, pp. 1-12, XP040440456.

N1—Congying, "Astronomy Activity Course", Xiamen University Press, 15th edition, p. 91, Sep. 2012.

N2 "Eyes on the Skies—400 Years of Telescopic Discovery", translated by Wang Hua, et al., Shanghai Science and Technology Literature Press, 2nd edition, p. 40, Jan. 2014.

* cited by examiner

HIGHLY HOMOGENEOUS GLASS-CERAMIC COMPONENT

CROSS REFERENCE TO RELATED APPLICATIONS

This application is a continuation of International Application No. PCT/EP2015/053576 filed Feb. 20, 2015, which claims the benefit under of German Application No. DE 10 2014 002 253 filed Feb. 21, 2014 and German Application No. DE 102014211700 filed Jun. 18, 2014, the entire contents of which are incorporated by reference herein.

BACKGROUND

1. Field of the Invention

The present invention relates to a glass-ceramic component having a low average coefficient of thermal expansion (CTE) and a high CTE homogeneity, to the use of such a component and to a process for producing such a component.

2. Description of Related Art

On pages 107-214, Bach, Hans (Editor): "Low Thermal Expansion Glass Ceramics", Springer Verlag Berlin, Heidelberg, N.Y., 1995, ISBN: 3-540-58598-2, describes the principle technology for producing the glass-ceramic Zerodur®, which is produced and sold by the applicant. Zerodur® is a lithium aluminosilicate glass-ceramic with a particularly low thermal expansion and a high stability. Zerodur® is used as base material for a multiplicity of precision applications, for example for producing mirrors for telescopes with large dimensions, but which is also used for producing smaller precision components, for instance stages for microlithography.

At present, Zerodur® is commercially available in the following expansion classes:

| | CTE (0; 50) |
|---|---|
| ZERODUR ® Expansion class 2 | 0 ± 100 ppb/K |
| ZERODUR ® Expansion class 1 | 0 ± 50 ppb/K |
| ZERODUR ® Expansion class 0 | 0 ± 20 ppb/K |
| ZERODUR ® Expansion class 0 SPECIAL | 0 ± 10 ppb/K |
| ZERODUR ® Expansion class 0 EXTREME | 0 ± 7 ppb/K |

A process for casting large homogeneous glass blocks as green glass for producing large glass-ceramic blocks is known from DE 102004052514A1. The method described in said application can be used to produce glass-ceramic components having a CTE homogeneity of up to 10 ppb/K, as are commercially available at the time of filing:

| CTE (0; 50) homogeneity tolerances | |
|---|---|
| Up to 18 tons | <30 ppb/K |
| Up to 6 tons | <20 ppb/K |
| Up to 0.3 tons | <10 ppb/K |

The above homogeneity tolerances mean e.g. that for Zerodur® components of more than 0.3 tons, a CTE (0;50) homogeneity of less than 10 ppb/K is not commercially available, up to 6 tons only a homogeneity of at most 20 ppb/K can be guaranteed. Even for small components of up to 0.3 tons, a CTE homogeneity of better than 6 ppb/K was not commercially available.

The demands made in terms of the homogeneity of a glass-ceramic component for precision applications increase constantly, however, and therefore continuous development is required to improve the homogeneity of glass-ceramics and the measures described to date in the prior art for improving the homogeneity are no longer adequate.

In particular, EUV (Extreme UV) lithography (EUVL) requires substrates for masks and mirrors which have an average CTE of less than 0±5 ppb/K in the temperature range of, for example, 19 to 25° C. and have a CTE homogeneity of 6 ppb/K or better.

SUMMARY

It was therefore an object of the present invention to provide glass-ceramic components which have an improved CTE homogeneity and also to provide measures which can be used to achieve such an improvement in homogeneity.

This object is achieved by the embodiments described in the claims.

In particular, a glass-ceramic component is provided which, at an application temperature $T_A$, has a CTE, preferably an average CTE, in the interval of 0±20 ppb/K, preferably in the interval of 0±15 ppb/K, more preferable in the interval of 0±10 ppb/K, according to specific embodiments in the interval of 0±5 ppb/K, and a CTE homogeneity of at most 5 ppb/K, preferably at most 4 ppb/K, most preferably at most 3 ppb/K.

These and other aspects and objects, features and advantages of the present invention will become apparent upon a consideration of the following detailed description and the invention when read in conjunction with the Figures.

It is to be understood that both the foregoing general description and the following detailed description are merely exemplary of the invention, and are intended to provide an overview or framework for understanding the nature and character of the invention as claimed.

The invention relates to glass-ceramic components having a low average coefficient of thermal expansion or CTE ("Coefficient of Thermal Expansion"). For the purposes of the invention, an "average CTE" is understood to mean the average of all CTE measurements carried out on a glass-ceramic component at various places. For the purpose of the invention, a "low average CTE" is understood to mean the a CTE (0;50) of 0±100 ppb/K, preferably 0±50 ppb/K, more preferably 0±20 ppb/K, even more preferably 0±10 ppb/K and most preferably 0±7 ppb/K.

The average CTE for the temperature range of 0 to 50° C. (CTE(0;50)) is usually reported. However, the average CTE can also be reported for other temperature ranges. For high-precision applications, the average CTE is reported in a considerably smaller temperature range around the later application temperature, for example a CTE(19;25) for microlithography components. As described herein below, the average CTE can also be reported for a specific application temperature $T_A$.

Figure 6:
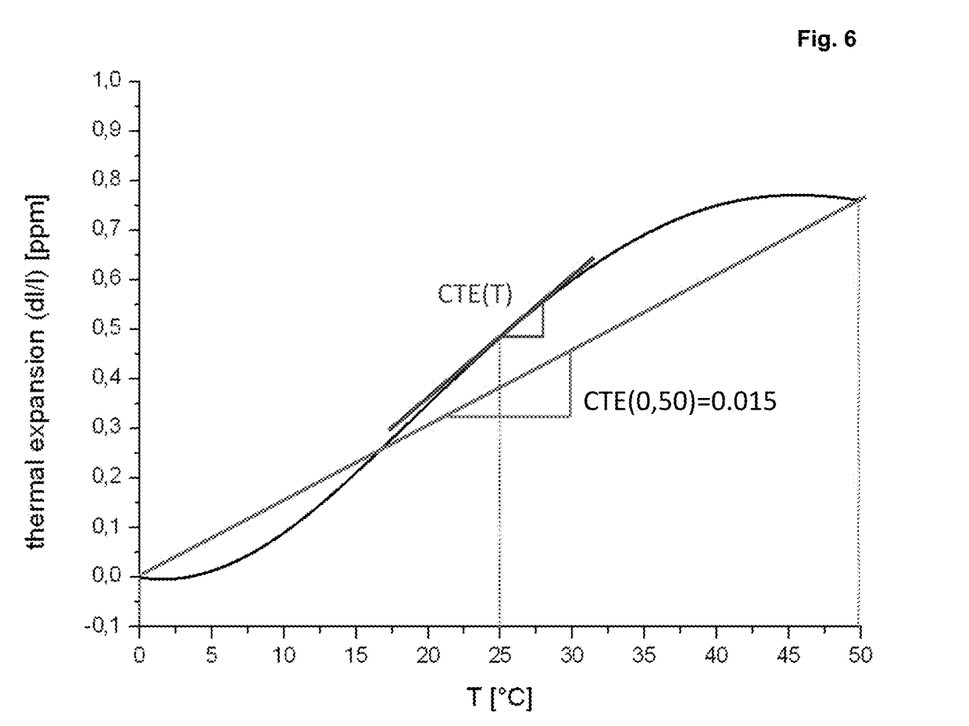
FIG. 6 schematically shows the determination of the CTE (0;50).

The average CTE for a temperature range can be determined by means of equation (1) below:

$$\text{CTE } [t_0;t]=(1/l_0)\times(l_t-l_0)/(t-t_0)=\Delta l/(l_0\times\Delta t) \quad (1)$$

where $t_0$ is the initial temperature, t is the measurement temperature, $l_0$ is the test specimen length at the initial temperature $t_0$, $l_t$ is the test specimen length at the measurement temperature t and $\Delta l$ is the corrected change in length undergone by the test specimen at a change in temperature $\Delta t$. The method is shown schematically in FIG. 6.

To determine an average CTE, the length of a test specimen of a glass-ceramic is measured at the initial temperature $t_0$, the test specimen is heated to a second temperature t and the length $I_t$ at this temperature is measured. The average CTE $[t_0; t]$ for the temperature range $t_0$ to t is obtained from the abovementioned formula (1). The thermal expansion can be determined by means of dilatometry, i.e. the determination of the change in length of a test specimen as a function of the temperature. An instrument for determining the average CTE is described, for example, in R. Mueller, K. Erb, R. Haug, A. Klaas, O. Lindig, G. Wetzig: "Ultraprecision Dilatometer System for Thermal Expansion Measurements on Low Expansion Glasses", 12$^{th}$ Thermal Expansion Symposium, Pittsburgh/Pa., P. S. Gaal and D. E. Apostolescu Eds., 1997, the contents of which are incorporated in their entirety into the present application.

In addition to this conventional determination of the average CTE, a determination of the average CTE as indicated in EP 1 321 440 was carried out in the examples for the glass-ceramic, since the true CTE at a particular temperature may be given incorrectly when considering the average CTE in a temperature interval. A CTE-T curve oscillating around the zero line may suggest a low average CTE, whereas the "true CTE" at the particular application temperature may lie outside specifications. The "true CTE" at a specific temperature is understood to mean the value lying on a CTE-T curve at this temperature. The contents of EP 1 321 440 are incorporated in their entirety into the present application.

The CTE is determined as a function of the temperature for this measurement method. The CTE(T) is then defined according to the formula (2) below:

$$CTE\ (T) = (1/l_0) \times (\partial l / \partial T) \qquad (2)$$

To produce a $\Delta l/l_0$–T curve or an expansion curve or to plot the change in length $\Delta l/l_0$ of a test specimen versus the temperature, the temperature-dependent change in length in the length of a test specimen from the initial length $l_0$ at the initial temperature $t_0$ to the length $I_t$ at the temperature t can be measured. Here, small temperature intervals of, for example, intervals of 5° C. or 3° C. are preferably chosen for determining a measurement point.

Such measurements can, for example, be carried out by dilatometric methods, interferometric methods, for example the method of Fabry-Perot, i.e. the measurement of the shift of interference fringes of laser beams reflected from the surfaces of a measurement sample during expansion, or other suitable methods.

The selected method for determining the $\Delta l/l_0$–T measurement points preferably has a precision of preferably at least ±0.10 ppm, more preferably of ±0.05 ppm, most preferably of ±0.01 ppm.

Furthermore, a glass-ceramic is usually defined by the possible deviations from the CTE average which make it still usable for the planned application. This deviation from the average CTE is reported as a range (e.g. "0±10×10$^{-6}$/K" or "0±10 ppb/K" for a range of from –10 to 10 ppb/K around an average CTE of 0 ppb/K). For the purposes of the invention, a "low average CTE" is understood to be a value of at most 0±20 ppb/K, more preferably at most 0±10 ppb/K, most preferably at most 0±7 ppb/K, according to specific embodiments at most 0±5 ppb/K.

According to the invention, the glass-ceramic component has a high CTE homogeneity. Here, the value of the CTE homogeneity ("total spatial variation of CTE") is understood to mean what is termed the peak-to-valley value, i.e. the difference between the respective highest and the respective lowest CTE value of the samples taken from a glass-ceramic. For the purposes of the invention, the value is reported in ppb/K, where 1 ppb/K=0.001×10$^{-6}$/K. The CTE homogeneity over the entire glass-ceramic component is at most 5 ppb/K, preferably at most 4 ppb/K, most preferably at most 3 ppb/K.

Furthermore, a glass-ceramic component can be characterized by the zero crossing of a CTE-T curve. If the zero crossing of the CTE-T curve of a glass-ceramic component lies at or in the proximity of the application temperature, the change in length given potential minor fluctuations in temperature around the application temperature is minimal. For precision applications, it is therefore generally the case that a glass-ceramic component having a zero crossing matched to the application temperature is used. The position of the zero crossing of the CTE-T curve can be set by correspondingly adapting the ceramization of the glass-ceramic. In particular, the CTE-T curve can have at least one zero crossing in a range of $T_A$±10 K, preferably $T_A$±5 K. Preferred application temperatures lie in the range of –60 to 100° C., more preferably of –40° C. to +80° C. Particular embodiments of the present invention relate to glass-ceramic components for application temperatures $T_A$ of 22° C., 40° C., 60° C., 80° C. and 100° C., which have a zero crossing of the CTE-T curve and/or tolerances as described above.

According to one embodiment of the invention, the CTE-T curve of the glass-ceramic has a gradient at the zero crossing of 5 ppb/K$^2$, more preferably ≤2.5 ppb/K$^2$, even more preferably ≤2 ppb/K$^2$.

Glass-ceramics for precision applications should also have a good internal quality. It is preferable for glass-ceramics to have at most 5 inclusions per 100 cm$^3$, more preferably at most 3 inclusions per 100 cm$^3$, most preferably at most 1 inclusion per 100 cm$^3$. For the purposes of the invention, inclusions are understood to mean both bubbles and crystallites having a diameter of more than 0.3 mm.

According to one embodiment of the invention, glass-ceramic components are provided which have a diameter or an edge length of at most 800 mm and a thickness of at most 100 mm and which have at most 5 inclusions, preferably at most 3 inclusions, more preferably at most 1 inclusion in each case per 100 cm$^3$ with a diameter of a magnitude of more than 0.03 mm.

In addition to the number of inclusions, the maximum diameter of the detected inclusions also serves as a measure of the internal quality. The maximum diameter of individual inclusions in the overall volume of a glass-ceramic component having a diameter of less than 500 mm is preferably at most 0.6 mm, and preferably at most 0.4 mm in the critical volume for the application, for example in the proximity of the surface. The maximum diameter of individual inclusions in glass-ceramic components having a diameter of 500 mm to less than 2 m is preferably at most 3 mm, and preferably at most 1 mm in the critical volume for the application, for example in the proximity of the surface.

DETAILED DESCRIPTION

For the purposes of the invention, a glass-ceramic is understood to mean inorganic, non-porous materials with a crystalline phase and a vitreous phase, with the matrix, i.e. the continuous phase, generally being a glass phase, i.e. a vitreous phase.

According to one embodiment of the present invention, a transparent glass-ceramic is provided. As a result of the transparency, it is possible for many properties of such a glass-ceramic, in particular of course the internal quality thereof, to be assessed better.

It is preferable to use a glass-ceramic composed of the system $Li_2O$—$Al_2O_3$—$SiO_2$ having the following composition (in % by weight based on oxide):

| | |
|---|---|
| $SiO_2$ | 50-70 |
| $Al_2O_3$ | 17-32 |
| $P_2O_5$ | 3-12 |
| $Li_2O$ | 2-5 |
| $Na_2O$ | 0-2 |
| $K_2O$ | 0-2 |
| MgO | 0-2 |
| CaO | 0-4 |
| BaO | 0-5 |
| SrO | 0-2 |
| ZnO | 0-4 |
| $TiO_2$ | 1-5 |
| $ZrO_2$ | 0-5 |

The glass-ceramic preferably has a proportion of $SiO_2$ of 50 to 70% by weight. The proportion of $SiO_2$ is more preferably at most 62% by weight, even more preferably at most 60% by weight. The proportion of $SiO_2$ is more preferably at least 52% by weight, even more preferably at least 54% by weight.

The proportion of $Al_2O_3$ is preferably 17 to 32% by weight. The glass-ceramic more preferably contains at least 20% by weight, even more preferably at least 22% by weight, $Al_2O_3$. The proportion of $Al_2O_3$ is more preferably at most 30% by weight, more preferably at most 28% by weight.

The phosphate content $P_2O_5$ of the glass-ceramic is preferably 3 to 12% by weight. The glass-ceramic more preferably contains at least 4% by weight, even more preferably at least 5% by weight, $P_2O_5$. The proportion of $P_2O_5$ is preferably limited to at most 10% by weight, more preferably to at most 8% by weight.

The glass-ceramic preferably also contains $TiO_2$ in a proportion of 1 to 5% by weight, with preference being given to at least 1.5% by weight $TiO_2$ being present. However, the proportion is preferably limited to at most 4% by weight, more preferably to at most 3% by weight.

The glass-ceramic can also contain $ZrO_2$ in a proportion of at most 5% by weight, preferably at most 4% by weight. $ZrO_2$ is preferably present in a proportion of at least 0.5% by weight, more preferably at least 1% by weight.

Furthermore, the glass-ceramic can contain alkali metal oxides such as $Li_2O$, $Na_2O$ and $K_2O$. $Li_2O$ may be present in a proportion of at least 2% by weight, preferably at least 3% by weight. The proportion of $Li_2O$ is limited to preferably at most 5% by weight, more preferably at most 4% by weight. $Na_2O$ and $K_2O$ are optionally present in the glass-ceramic. The proportion of $Na_2O$ and/or $K_2O$ can in each case and independently be at most 2% by weight, preferably at most 1% by weight, most preferably at most 0.5% by weight. $Na_2O$ and $K_2O$ can in each case and independently be present in a proportion of at least 0.01% by weight, preferably at least 0.02% by weight, more preferably at least 0.05% by weight, in the glass-ceramic.

The glass-ceramic can also contain alkaline earth metal oxides such as MgO, CaO, BaO and/or SrO, and also further divalent metals such as ZnO. The proportion of CaO is preferably at most 4% by weight, more preferably at most 3% by weight, even more preferably at most 2% by weight. The glass-ceramic preferably contains at least 0.1% by weight, more preferably at least 0.5% by weight, CaO. MgO can be present in the glass-ceramic in a proportion of at most 2% by weight, preferably at most 1.5% by weight, and/or preferably at least 0.1% by weight. The glass-ceramics can contain BaO in a proportion of less than 5% by weight, preferably at most 4% by weight, and/or preferably at least 0.1% by weight. In specific embodiments, the glass-ceramic may be BaO-free. The glass-ceramics can contain SrO in a proportion of at most 2% by weight and/or preferably at least 0.1% by weight. In specific embodiments, the glass-ceramic may be SrO-free. As further metal oxide, the glass-ceramic preferably may contain ZnO in a proportion of preferably at least 1% by weight, more preferably at least 1.5% by weight. The proportion of ZnO is limited to at most 4% by weight, preferably at most 3% by weight.

The glass-ceramic can also contain one or more customary refining agents such as $As_2O_3$, $Sb_2O_3$, SnO, $SO_4^{2-}$, $F^-$, $Cl^-$, $Br^-$ or a mixture of these in a proportion of at most 1% by weight.

Transparent glass-ceramics with low coefficients of thermal expansion are known in this system, and commercially available products such as Zerodur®, Zerodur® M (both SCHOTT AG) and Clearceram® (Ohara) can be mentioned by way of example. These glass-ceramics usually contain approximately 50 to 80% of solid solutions with a high quartz content, also known as β-eucryptite solid solutions, as the main crystal phase. This crystallization product is a metastable phase which, depending on the crystallization conditions, changes its composition and/or structure or is converted into a different crystal phase. The solid solutions with a high quartz content have a thermal expansion which is very low or even falls as the temperature rises.

One embodiment of the invention relates to glass-ceramic components having a large volume. For the purposes of the present application, this term is intended to mean a glass-ceramic component having a mass of at least 500 kg, preferably at least 1 t, more preferably at least 2 t, in one embodiment of the invention at least 5 t, or edge lengths (width and/or depth) in the case of rectangular shapes of at least 0.5 m, more preferably at least 1 m, and a thickness (height) of at least 50 mm, preferably 100 mm, or in the case of round shapes a diameter of at least 0.5 m, more preferably at least 1 m, more preferably at least 1.5 m, and a thickness (height) of at least 50 mm, preferably 100 mm. In specific embodiments of the invention, the glass-ceramic components can also be even larger glass-ceramic components having, for example, a diameter of at least 3 m or at least 4 m or greater and a weight of 10 to 15 tons. The maximum size of the glass-ceramic components depends on the size of the melting tank. However, it is also possible to cast larger glass-ceramic components with a diameter of 8 m and having a weight of between 40 and 60 tons. In particular, the invention also relates to rectangular glass-ceramic components, in which it is preferable that at least one surface has a surface area of at least 1 m$^2$, preferably at least 1.2 m$^2$, more preferably at least 1.4 m$^2$.

It is generally the case that large-volume glass-ceramic components having a considerably greater base than height are produced. The process according to the invention is also suitable, however, for producing large-volume glass-ceramic components with a high CTE homogeneity which have a shape that approximates a cube or a sphere. In addition to the volume and the weight, a glass-ceramic component of this type can also be described by a shape factor R=h/d, where h corresponds to the height of the glass block and d corresponds to the diameter. While the shape factors in the production of some large-volume glass components, such as lenses or telescope mirrors, generally lie below 0.1, there is also a demand for large-volume glass components having shape factors of above 0.1, for instance in the range between 0.1 and 0.3, for example prisms. A further embodiment of the present invention therefore relates to large-volume glass-ceramic components having high shape factors, which can lie between approximately 0.1 and 0.3 up to at most approximately 0.5. Here, the shape factor R=h/d is defined as the ratio of height h to transverse extent d, with the transverse extent d in the case of a cylindrical shape being the diameter thereof and in the case of a cuboidal shape being the diagonal thereof.

A further embodiment relates to precision components with relatively small dimensions, in particular in the case of rectangular shapes with edge lengths (width and/or depth) or in the case of round areas with diameters of at least 100 mm and/or less than 500 mm and a thickness of less than 50 mm, preferably less than 10 mm and/or at least 1 mm, more preferably at least 2 mm. Precision components of this type can be used in microlithography, for example.

Components for microlithography are commonly used under standard clean room conditions, in particular at a room temperature of 22° C. The CTE can be adapted to this application temperature. However, components of this type are subjected to various process steps, for example coating with metallic layers, cleaning, patterning and/or exposure processes, in which temperatures which are higher than those that prevail during later use in the clean room are present. It is advantageous if a component of this type has a low thermal expansion not only at the later application temperature, but also under the thermal loading caused by the process steps. The present invention therefore also relates to components in which the temperature interval which satisfies the CTE tolerance of 0±20 ppb/K, preferably of 0±15 ppb/K, more preferably 0±10 ppb/K, has at least an extent of 10 K, preferably at least 15 K, more preferably at least 20 K. Furthermore, according to this embodiment of the invention, preference is given to components having a CTE which is optimized to an application temperature of 20° C., 40° C., 50° C., 60° C. and/or 80° C.

In the following, measures are described which can improve the homogeneity of glass-ceramic components. Here, each one of these measures already leads to an improvement in the homogeneity. According to the invention, these can be employed individually or as a combination of two or more thereof during the production of a glass-ceramic component.

A glass-ceramic is generally produced as follows: suitable raw materials are melted in a suitable composition, refined, homogenized and then hot-formed to form a glass blank or green body or the green glass. The "green body" of a glass-ceramic is understood to mean a vitreous body which has been melted from a suitable composition and which can be converted into a glass-ceramic by treatment with a suitable temperature programme.

In particular, the influence of the batch production on the homogeneity of a glass-ceramic component was examined.

Firstly, it may be advantageous to set the grain size distribution of the components of the batch. This can have an influence on the melting properties and should be selected such that it is possible to achieve unproblematic melting and therefore the most homogeneous melt possible. Surprisingly, it is not advantageous for good homogeneity to select all components in a particularly fine grain size. A mixture of components of different grain sizes has proved to be advantageous, for example a division of the grain sizes of the components into at least two, for example three, classes. Division into 4 or 5 classes may also be advantageous. By way of example, the batch can comprise 10 to 15% by weight of a fine fraction having a grain size of a class 1, i.e. a mean grain diameter of 1-50 μm, 60 to 85% by weight of a medium fraction having a grain size of a class 2, i.e. a mean grain diameter of 10-250 μm and 5 to 10% by weight of a coarse fraction having a grain size of a class 3, i.e. a grain diameter of 100-1000 μm.

It is preferable to select starting components which can be readily melted, where possible the nitrates, carbonates or phosphates, if appropriate also the oxides, of the raw materials required, for example quartz powder, aluminium oxide, aluminium hydroxide, aluminium metaphosphate, aluminium orthophosphate, magnesium carbonate, magnesium phosphate, zirconium sand, zirconium oxide, zinc oxide, titanium dioxide, lithium carbonate, lithium nitrate, potassium carbonate and potassium nitrate.

It has furthermore been found that it is advantageous in the production of glass-ceramics to control the accuracy of the batch composition.

The batch of the starting components is generally weighed out in charges. In the production of optical glasses, a charge size which corresponds to approximately 10 to 25% by weight of the later quantity of the glass melt in the melting tank has proved to be expedient. It has surprisingly been found that smaller charge sizes can lead to an increase in the homogeneity of the glass-ceramic component when producing green glasses for glass-ceramic components of high homogeneity. According to the invention, in one embodiment of the invention, it is therefore the case that batch charges which correspond to less than 10% by weight, preferably less than 5% by weight, of the later quantity of the green glass melt in the melting tank are weighed out.

It has furthermore been found that the weighing-out operation should be performed at least with an accuracy of preferably at least ±0.3% by weight, more preferably at least ±0.1% by weight, most preferably at least ±0.05% by weight, since even relatively minor differences in composition and therefore the formation of striae (streaks) and deviations in homogeneity can be avoided by this measure.

Furthermore, for introducing the batch into the melting tank, the batch can be moistened, in order to avoid loss through carry-over in particular of finely particulate components. For this purpose, at least 1% by weight, more preferably at least 3% by weight, water can be added to the batch, for example. It is preferable for at most 10% by weight water to be added, however.

In addition to avoiding the carry-over of finely particulate components, it is possible inter alia for the water or OH content of the melt and therefore of the resulting glass-ceramic to be set by moistening the batch. It has surprisingly been found that a higher OH content can have an advantageous effect on the homogeneity of a glass-ceramic. It is assumed that the presence of the water molecules makes the molecular bonds of the components in the melt less firm, and as a result the melt has a lower viscosity and can be homogenized more easily and more effectively. The relatively low viscosity can also bring about better refinement, and therefore it is possible to obtain glass-ceramic components with a particularly low number of bubbles.

Common LAS glass-ceramics have an OH content of approximately from 0.03 to 0.05 mol/l. It has been found that the setting of the OH content of the glass-ceramic to a content of at least 0.06 mol/l, more preferably at least 0.07 mol/l can prove to be advantageous for the CTE homogeneity of a glass-ceramic. The OH content is preferably at most 0.15 mol/l, more preferably at most 0.13 mol/l, further preferably at most 0.12 mol/l, further preferably at most 0.11 mol/l, further preferably at most 0.10 mol/l, further preferably at most 0.095 mol/l. To determine the OH content, a plate of the glass-ceramic having a thickness of 0.57 mm was measured in an infrared spectrometer and the OH band of the IR spectrum was determined quantitatively between 2.7 and 3.3 μm with respect to a calibration measurement and converted into the OH content.

The OH content of the melt can furthermore be set by hydrous starting components. By way of example, it is preferred according to the invention not to use aluminium oxide but rather aluminium hydroxide in a proportion of at least 50% by weight, more preferably at least 80% by weight, of the total content of aluminium oxide as starting component. According to specific embodiments, exclusively aluminium hydroxide is used as starting component. Moreover, the OH content can also be set by using other hydroxides, for example $Mg(OH)_2$, LiOH, KOH and/or other hydroxides.

After the components have been weighed out, the batch is mixed by means of a conventional stirrer and then transported to the melting tank and introduced therein.

The green glass is melted in a plurality of steps: melting, optionally, homogenizing, refining, optionally, further homogenizing, optionally, a standing phase, casting.

After the batch has been melted completely, a first homogenization preferably takes place. The melt can be homogenized by bubbling, by thermal means or by mechanical means. Thermal homogenization here is understood to mean that the convection of the melt is promoted by increasing the temperature or different heating of the tank surfaces. Thereafter, the temperature of the melt is increased to approximately 1600° C. for the refining operation. This can be followed by a second homogenization phase. By way of example, the melt can be kept at an elevated temperature for a number of days, with the duration of the holding time being dependent on the volume of the melt. It is assumed that the melt is further homogenized on a molecular level during such a holding or standing phase.

Then, the green glass is cast in metal moulds, as are described, for example, in DE 102004052514A1. The casting mould is then moved away laterally from the region beneath the melting tank and moved into a furnace for controlled cooling. The controlled cooling to room temperature is effected at a sufficiently low cooling rate in order to avoid stresses and the formation of cracks.

The glass block thus produced is preferably subjected to a visual inspection for freedom from bubbles, freedom from cracks, etc. This can be followed by a first machining operation, in particular the removal of the surface regions, before the ceramization of the green body to form the glass-ceramic is carried out.

During the heat treatment referred to as ceramization, the green glass or the glass or the green body is converted into a glass-ceramic by controlled volume crystallization. During this heat treatment, crystallization nuclei of the same type or a different type are formed in the glass in a first conversion step ("crystallization nucleation"). Crystallization nuclei or crystal nuclei are understood to mean submicroscopic crystalline aggregates of a characteristic size. In a second conversion step ("crystal growth"), if appropriate at a slightly higher temperature, crystals or crystallites grow from the crystal nuclei.

The present invention also relates to the use of the glass-ceramic according to the invention in astronomy, for example as mirror supports for large segmented telescopes or monolithic astronomical telescopes or else ultra-light mirror substrates, as precision components, such as standards for precision measurement technology, mechanical precision parts, e.g. for ring laser gyroscopes, coil springs for the watchmaking industry, in LCD lithography, for example as mirrors and prisms, and also in microlithography, for example as mask holders, wafer stages and reference plates, and also as substrates for mask blanks and mirrors in EUV lithography.

The entire disclosures of all applications, patents and publications, cited above and below are hereby incorporated by reference.

It goes without saying that the features of the invention mentioned above and those still to be explained herein below can be used not only in the respectively indicated combination but also in other combinations, without departing from the scope of the invention. The present invention will be illustrated below by a series of examples. However, the present invention is not limited to the examples mentioned.

Example 1

The starting compounds named in Table 1 were weighed out with an accuracy of ±0.1% by weight (% by weight, based on oxide). In this case, the size of the charge weight was 4% by weight of the total weight of the melt. Before being introduced into the melting tank, the batch was moistened with 8% by weight water.

TABLE 1

|  | Example 1 | Raw material | Grain size fraction |
| --- | --- | --- | --- |
| $SiO_2$ | 56.1 | Quartz powder | Medium/coarse (5:1) |
| $Al_2O_3$ | 25.5 | $Al(OH)_3$ | Medium |
|  |  | Al orthophosphate | Fine |
| $P_2O_5$ | 7.1 | Al orthophosphate | Fine |
| $Li_2O$ | 3.5 | $Li_2CO_3$ | Coarse |
| $Na_2O$ | 0.2 | $Na_2O$ | Medium |
| $K_2O$ | 0.5 | Potassium nitrate | Coarse |
| MgO | 1.0 | $MgCO_3$ | Coarse |
| ZnO | 1.5 | ZnO | Fine |
| $TiO_2$ | 2.2 | $TiO_2$ | Fine |
| $ZrO_2$ | 1.9 | Zirconium sand | Coarse |
| $As_2O_3$ | 0.5 | $As_2O_3$ |  |
| Sum total | 100.0 |  |  |

This composition was melted in a melting tank measuring 28 m³ for a period of time of several days, with the temperature being kept at approximately 1600° C. The decomposition of $As_2O_3$ in the process forms refining gases, which carry along small gaseous inclusions and homogenize the melt. During the refining phase and also during a subsequent cooling phase, the glass melt is homogenized further. In particular, controlling the temperature of the tank surface induces convection of the melt, in order to promote the homogenization. During a subsequent cooling phase, which can similarly last for several days, the temperature of the glass melt is reduced to approximately 1400° C., and the latter is then cast into (a) cylindrical casting moulds having a diameter of 1550 mm and a height of 350 mm (Example 1-A) and (b) rectangular casting molds having an edge length of 1.3 m and a height of 350 mm (Example 1-B). The blocks of the green glass thus produced were ceramized under the following conditions after removal of the marginal regions: firstly, the blank was heated at a heating rate of 0.5° C./h to a temperature of between 630 and 660° C. The heating rate was then reduced to 0.01° C./h and heating was continued until a temperature of between 770 and 800° C. was reached. This temperature was maintained for 80 hours. Then, the blank was cooled at a cooling rate of −1° C./h to room temperature.

Example 1-A

A glass-ceramic plate having a diameter of 1.5 m was cut from a cylindrical ceramized block (a), and the CTE homogeneity of said glass-ceramic plate was determined as described below. Furthermore, the CTE homogeneity of smaller rectangular glass-ceramic components having an area of 110×110 mm and, respectively, 150×110 mm was determined.

TABLE 2

| | Example 1-A | Example 1-A | Example 1-A |
|---|---|---|---|
| Dimensions of glass-ceramic component | cylindrical form: diameter: 1.5 m height: 0.23 m | rectangular form (150 × 110 × 5) mm | rectangular form (110 × 110 × 5) mm |
| Weight of glass-ceramic component | 1.03 t | 284 g | 153 g |
| OH content [mol/l] | 0.087 | 0.087 | 0.087 |
| Average CTE (0; 50) [ppb/K] | 0.0 | 0.0 | 0.0 |
| Average CTE (19; 25) [ppb/K] | 3.0 | 3.0 | 3.0 |
| CTE homogeneity [ppb/K] | 3 | 2.5 | 2 |
| Inclusions >0.3 mm | | | |
| Average number per 100 cm³ Inclusions >0.03 mm | 1 | 0 | 0 |
| Average number per 100 cm³ | 3 | 1 | 1 |
| Maximum size [mm] | 0.5 | 0.05 | 0.05 |

Example 1-B

Further blocks of the green glass from Example 1 were ceramized under the same conditions as described in Example 1, but with the following holding times to optimize the glass ceramics for different application temperatures $T_A$:

TABLE 3

Figure 5:
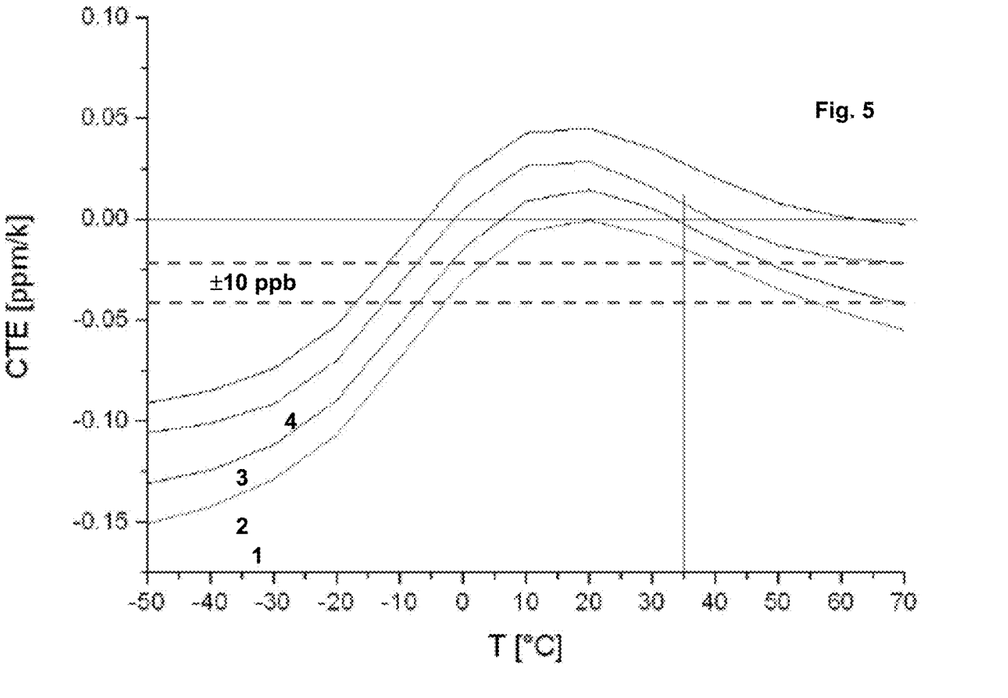
FIG. 5 shows the comparison of the CTE-T curves of a plurality of differently ceramicized glass-ceramic components, the zero crossings of the CTE-T curves of which lie between −10° C. and +60° C.

| | Ex. 1-B-a | Ex. 1-B-b | Ex. 1-B-c | Ex. 1-B-d |
|---|---|---|---|---|
| Ceramization holding times [h] | 70 | 110 | 140 | 170 |
| FIG. 5, curve no. | 1 | 2 | 3 | 4 |
| Zero crossing(s) of CTE-T curve | 20° C. | 5° C. 32° C. | −2° C. 40° C. | −6° C. 58° C. |
| Application temperature $T_A$ | 22° C. | 30° C. | 40° C. | 60° C. |
| CTE ($T_A$) [ppb/K] | −4 | 5 | 0 | −3 |
| Temperature range around $T_A$ in which CTE deviates at most ±10 ppb deviates from 0 ppb/K [K] | 8-31 | 23-39 | 26-33 | 47-82 |
| Extent of temperature range [K] | 23 | 16 | 7 | 35 |

Test specimens were taken from the resulting glass-ceramics, the CTE-T curve of said test specimens being shown in FIG. 5. The glass-ceramic plates having edge lengths of 100×100×5 mm which were produced from these glass-ceramics likewise had a CTE homogeneity of 2 ppb/K.

Example 1-C

A rectangular lass-ceramic plate having edge lengths of 1.2 m was cut from the ceramized rectangular block (b), and the CTE homogeneity of said glass-ceramic plate was determined as described below.

TABLE 4

| | Example 1-A | Example 1-A | Example 1-A |
|---|---|---|---|
| Dimensions of glass-ceramic component (width × depth × height) | (1.2 × 1.2 × 0.235) m | (150 × 110 × 5) mm | (110 × 110 × 5) mm |
| Weight of glass-ceramic component | 0.86 ton | 284 g | 153 g |
| OH content [mol/l] | 0.088 | 0.088 | 0.088 |
| Average CTE (0; 50) [ppb/K] | −12.2 | −12.2 | −12.2 |
| CTE homogeneity [ppb/K] | 5 | 4 | 3 |
| Inclusions >0.3 mm | | | |
| Average number per 100 cm³ | 3 | 1 | 1 |
| Maximum size [mm] | 1.5 | 0.4 | 0.4 |

Casting and ceramizing a rectangular shape of a glass ceramic is more difficult in view of the homogeneity of the resulting block of green glass and glass ceramic component since the flow of the glass during casting into the in particular the corner portions leads to unfavourable currents and thus to increased inhomogeneity. However, according to the present invention it is possible to cast large rectangular blocks with outstanding homogeneity.

Figure 1:
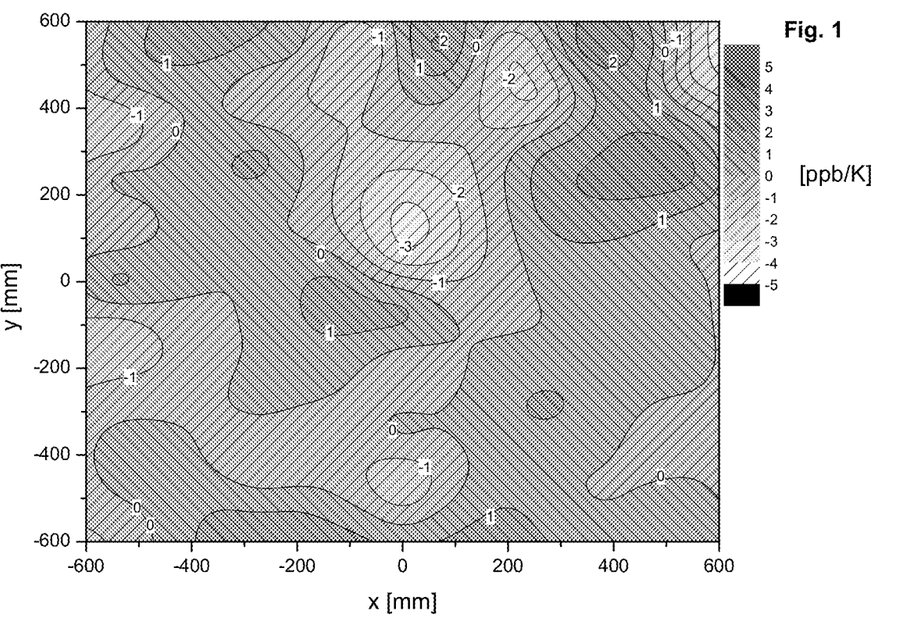
FIG. 1 shows the depiction of the two-dimensional measurement of the derivation of the CTE from the mean CTE value of a square glass-ceramic component having an area of 1.2×1.2 m edge length and a thickness of 225 mm according to Example 1-B.
Figure 2:
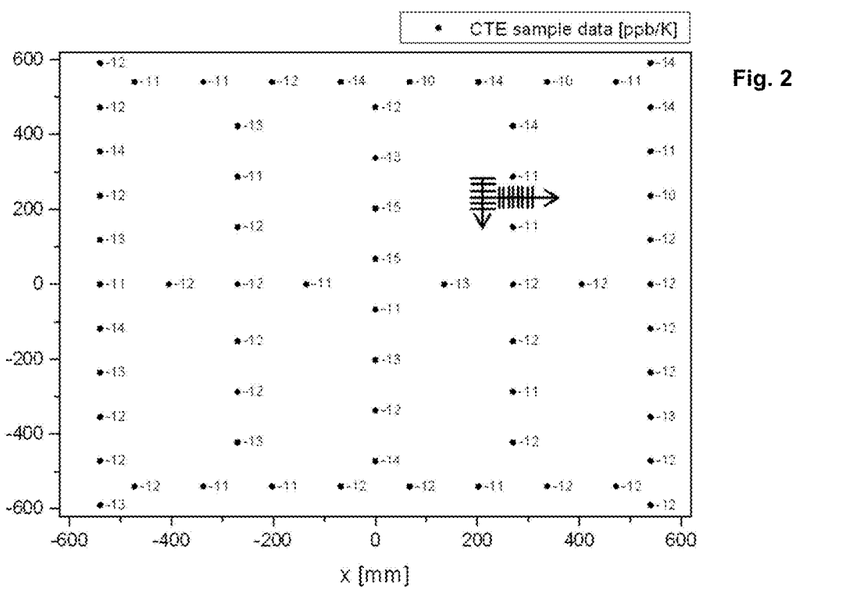
FIG. 2 shows the depiction of the two-dimensional measurement of the CTE of a square glass-ceramic component having an area of 1.2×1.2 m edge length and a thickness of 225 mm and the position of the test specimens taken for the CTE homogeneity measurement of the glass-ceramic component according to Example 1-B.

FIG. 1 shows a two-dimensional representation of the CTE homogeneity of the rectangular glass-ceramic component from Example 1 having edge lengths of 1.2×1.2 m. To determine the CTE homogeneity, 64 test specimens were cut from the glass-ceramic component and measured separately. FIG. 2 shows the positions of the 64 test specimens taken. All CTE values measured lay between −15 and −10 ppb/K and thus correspond to CTE(0;50) 0±20 ppb/K. The CTE homogeneity was 5 ppb/K.

Figure 3:
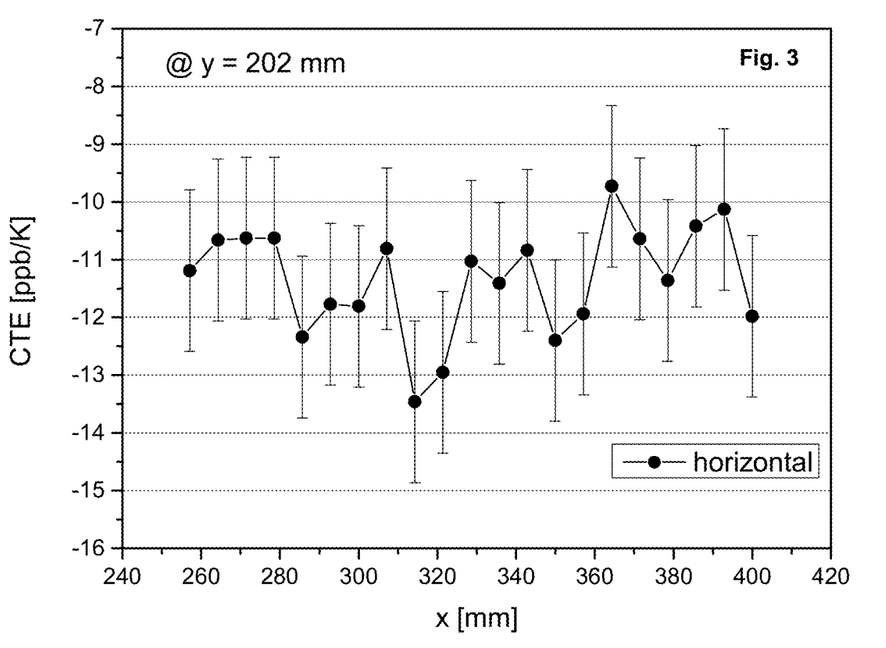
FIG. 3 shows the horizontal distribution of the CTE values of the glass-ceramic component tested in respect of the CTE homogeneity.
Figure 4:
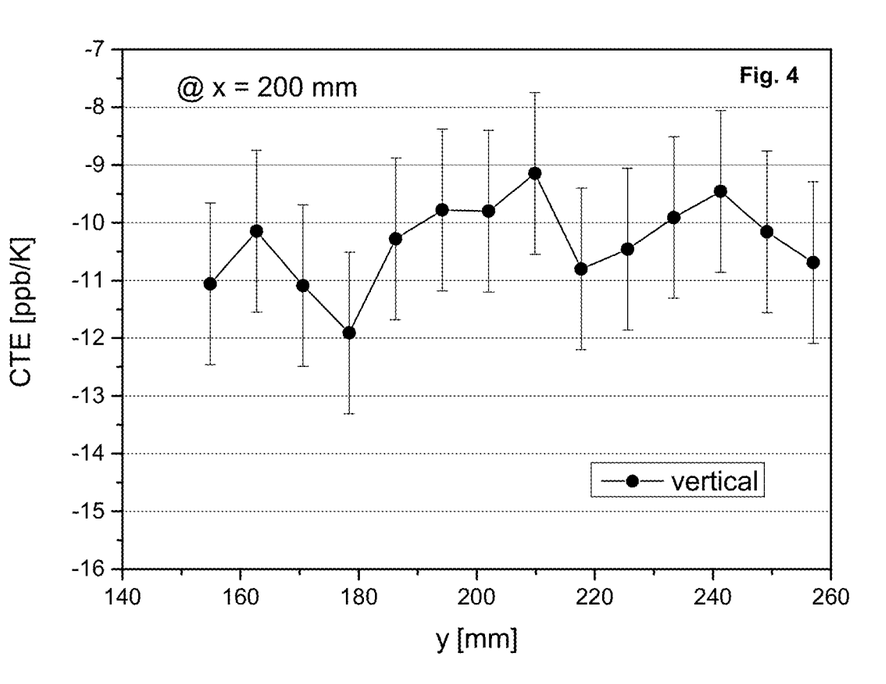
FIG. 4 shows the vertical distribution of the CTE values of the glass-ceramic component tested in respect of the CTE homogeneity.

Furthermore, the CTE homogeneity of smaller rectangular glass-ceramic components having an area of 110×110 mm and, respectively, 150×110 mm was determined. FIG. 2 shows the positions of the test specimens taken for this determination. FIGS. 3 and 4 show CTE values for the individual test specimens of the test specimens taken in the horizontal (FIG. 3) and, respectively, in the vertical (FIG. 4) direction. The tolerances brought about by the measurement are shown in FIGS. 3 and 4. The CTE homogeneity was 3 ppb/K (110×110 mm) and (150×110 mm), together 4 ppb/K.

Example 2

A glass-ceramic raw glass melt was melted as described in Example 1 and cast into a round casting mould having a diameter of 4.5 m and a height of 350 mm. After cooling, the marginal regions were removed and the raw glass block was ceramized: firstly, the blank was heated at a heating rate of 0.5° C./h to a temperature of between 630 and 660° C. The heating rate was then reduced to 0.01° C./h and heating was continued until a temperature of between 770 and 800° C. was reached. This temperature was maintained for 80 hours. Then, the blank was cooled at a cooling rate of −1° C./h to room temperature.

A round glass-ceramic disc having a diameter of 4263 mm, a thickness of 80 mm and a weight of 2.89 ton was cut from the ceramized block, and the CTE homogeneity of said glass-ceramic disc was determined as described in the table below.

TABLE 5

|  | Example 2 |
|---|---|
| OH content [mol/l] | 0.088 |
| Average CTE (0; 50) [ppb/K] | 0.0 |
| Average CTE (5; 35) [ppb/K] | 6.0 |
| CTE homogeneity (0; 50) | 3 ppb/K |
| CTE homogeneity (5; 35) | 6 ppb/K |
| Inclusions >0.3 mm |  |
| Average number per 100 cm$^3$ | 3 |
| Maximum size [mm] | 1.5 |

The glass-ceramic disc had the internal quality described in Table 5:

TABLE 6

|  | Critical volume | Non-critical volume |
|---|---|---|
| Maximum diameter of the inclusions [mm] | ≤2.0 | ≤4.0 |
| Number of inclusions per 100 cm$^3$ | ≤1 | ≤1 |
| Average volume density [particles/cm$^3$] | ≤5 × 10$^{-6}$ | ≤5 × 10$^{-6}$ |
| Striae (photoelastic examination) | None verified | None verified |
| Stress in the volume [nm/cm] | ≤|−2.8| | ≤|−2.8| |

For the purposes of this Example 2, the term "critical volume" is understood to mean the volume from the surface down to a depth of 2 mm.

Comparative Examples

A glass-ceramic raw glass melts was melted basically as described in Example 1 but with the differences as noted below.

The melts were cast into a cylindrical casting molds having a diameter of 1550 mm and a height of 350 mm and processed and ceramized into cylindrical glass ceramic blanks having a diameter of 1.5 m and a height of 350 mm as described in Example 1-A. The physical properties are also described in Table 7 below.

TABLE 7

|  | Comparative Example 1 | Comparative Example 2 |
|---|---|---|
| Production differences to Ex. 1 | | |
| Weighting accuracy | 0.3 wt. % | 0.5 wt. % |
| Size of batch charge | 12% | 12% |
| Starting compounds | (same as Ex. 1) | Al(OH) replaced by Al$_2$O$_3$ |
| Grain size | | |
| Fine fraction | 20% by weight | 20% by weight |
| Medium fraction | 70% by weight | 60% by weight |
| Coarse fraction | 10% by weight | 20% by weight |
| Water added to batch | 5% by weight | 3% by weight |
| Physical properties of glass ceramic | | |
| OH content [mol/l] | 0.06 | 0.05 |
| Average CTE (0; 50) [ppb/K] | 39.9 | 42.4 |
| CTE homogeneity [ppb/K] | 4 | 6 |
| Inclusions >0.3 mm | | |
| Average number per 100 cm$^3$ | 4 | 6 |
| Maximum size [mm] | 1.0 | 1.5 |

Comparing the results of the Comparative Examples 1 and 2 with the Examples, it is shown that by the present invention, glass ceramic components having a higher CTE homogeneity, better average CTE and better internal quality can be produced.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A low thermal expansion glass-ceramic component that has an application temperature that lies within a range of −60° to 100° C., and comprises at the application temperature, a coefficient of thermal expansion (CTE) in an interval of 0±15 ppb/° K, and a total spatial variation of CTE over the entire glass-ceramic component of at most 3 ppb/K, wherein the component has a mass of at least 500 kg.

2. The glass-ceramic component according to claim 1, wherein the interval is 0±10 ppb/K.

3. The glass-ceramic component according to claim 1, wherein the application temperature is selected from the group consisting of 22° C., 30° C., 40° C., 60° C., 80° C., and 100° C.

4. The glass-ceramic component according to claim 1, further comprising a temperature interval that satisfies a CTE tolerance of 0±10 ppb/K and has at least an extent of 10 K.

5. The glass-ceramic component according to claim 1, wherein the component has a rectangular shape with at least one surface having a surface area of at least 1 m$^2$.

6. The glass-ceramic component according to claim 1, wherein the component comprises an LAS glass-ceramic with the following composition (in % by weight based on oxide):

| SiO$_2$ | 50-70, |
|---|---|
| Al$_2$O$_3$ | 17-32, |
| P$_2$O$_5$ | 3-12, |

-continued

| | |
|---|---|
| Li$_2$O | 2-5, |
| Na$_2$O | 0-2, |
| K$_2$O | 0-2, |
| MgO | 0-2, |
| CaO | 0-4, |
| BaO | 0-5, |
| SrO | 0-2, |
| ZnO | 0-4, |
| TiO$_2$ | 1-5, and |
| ZrO$_2$ | 0-5. |

7. The glass-ceramic component according to claim 1, wherein the component comprises a glass-ceramic with an OH content of at least 0.06 mol/l.

8. The glass-ceramic component according to claim 1, wherein the component is a component for use in a field selected from the group consisting of astronomy, metrology, LCD lithography, microlithography, and precision measurement technology.

9. The glass-ceramic component according to claim 1, wherein the total spatial variation of CTE over the entire glass-ceramic component is at most 5 ppb/K in a temperature range from 0° C. to less than 15° C.

10. The glass-ceramic component according to claim 9, wherein the temperature range further comprises from greater than 30° C. to 50° C.

11. The glass-ceramic component according to claim 10, wherein the temperature range further comprises from 15° C. to 30° C.

12. The glass-ceramic component according to claim 1, wherein the total spatial variation of CTE over the entire glass-ceramic component is at most 5 ppb/K in a temperature range from 0° C. to 50° C.

13. The glass-ceramic component according to claim 1, wherein the low thermal expansion glass-ceramic component is produced in a batch and at least 1% by weight to at most 10% by weight water is added to the batch.

14. An astronomical mirror comprising a low thermal expansion glass-ceramic component, that has an application temperature that lies within a range of −60° to 100° C., and comprises, at the application temperature, a coefficient of thermal expansion (CTE) in an interval of 0±15 ppb/K, and a total spatial variation of CTE over the entire glass-ceramic component of at most 3 ppb/K, wherein the glass-ceramic component has a diameter of at least 3 m.

15. An extreme ultraviolet lithography device comprising a low thermal expansion glass-ceramic component, that has an application temperature that lies within a range of −60° to 100° C., and, at the application temperature has a coefficient of thermal expansion (CTE) in an interval of 0±15 ppb/K, and a total spatial variation of CTE over the entire glass-ceramic component of at most 3 ppb/K, wherein the component has an edge length, in the case of a rectangular shape, or a diameter, in the case of a round shape, of at least 0.5 m.

16. The device according to claim 15, wherein the extreme ultraviolet lithography device is a mask or a mirror.

17. A low thermal expansion glass-ceramic component that has an application temperature that lies within a range of −60° to 100° C., and comprises, at the application temperature, a coefficient of thermal expansion (CTE) in an interval of 0±15 ppb/K, and a total spatial variation of CTE over the entire glass-ceramic component of at most 3 ppb/K, wherein the glass-ceramic component has an edge length, in the case of a rectangular shape, or a diameter, in the case of a round shape, of at least 0.5 m.

18. The glass-ceramic component according to claim 17, wherein the component comprises an LAS glass-ceramic with the following composition (in % by weight based on oxide):

| | |
|---|---|
| SiO$_2$ | 50-70, |
| Al$_2$O$_3$ | 17-32, |
| P$_2$O$_5$ | 3-12, |
| Li$_2$O | 2-5, |
| Na$_2$O | 0-2, |
| K$_2$O | 0-2, |
| MgO | 0-2, |
| CaO | 0-4, |
| BaO | 0-5, |
| SrO | 0-2, |
| ZnO | 0-4, |
| TiO$_2$ | 1-5, and |
| ZrO$_2$ | 0-5. |

19. The glass-ceramic component according to claim 17, wherein the component comprises a glass-ceramic with an OH content of at least 0.06 mol/l.

20. The glass-ceramic component according to claim 17, wherein the component is a component for use in a field selected from the group consisting of astronomy, metrology, LCD lithography, microlithography, and precision measurement technology.

21. A low thermal expansion glass-ceramic component that has an application temperature that lies within a range of −60° to 100° C., and comprises, at the application temperature, a coefficient of thermal expansion (CTE) in an interval of 0±15 ppb/K, and a total spatial variation of CTE over the entire glass-ceramic component of at most 3 ppb/K, wherein the glass-ceramic component has a diameter, of at least 3 m.

\* \* \* \* \*